United States Patent
Geiger et al.

(10) Patent No.: US 6,703,321 B2
(45) Date of Patent: Mar. 9, 2004

(54) LOW THERMAL BUDGET SOLUTION FOR PMD APPLICATION USING SACVD LAYER

(75) Inventors: Fabrice Geiger, Meylan (FR); Frederic Gaillard, Voiron (FR)

(73) Assignee: Applied Materials Inc., Santa Clara, CA (US)

(*) Notice: Subject to any disclaimer, the term of this patent is extended or adjusted under 35 U.S.C. 154(b) by 0 days.

(21) Appl. No.: 09/822,824

(22) Filed: Mar. 30, 2001

(65) Prior Publication Data

US 2002/0006729 A1 Jan. 17, 2002

(30) Foreign Application Priority Data

Mar. 31, 2000 (EP) .............................. 00400901

(51) Int. Cl.$^7$ ..................... H01L 21/31; H01L 21/469
(52) U.S. Cl. ...................... 438/760; 438/632
(58) Field of Search ................... 438/632, 760, 438/765, 778, FOR 395, FOR 397

(56) References Cited

U.S. PATENT DOCUMENTS

| | | | |
|---|---|---|---|
| 4,983,546 A | | 1/1991 | Hyun et al. |
| 5,139,967 A | | 8/1992 | Sandhu et al. |
| 5,314,538 A | * | 5/1994 | Maeda et al. ............... 118/715 |
| 5,814,165 A | * | 9/1998 | Tatah et al. ................. 148/565 |
| 6,297,067 B1 | * | 10/2001 | Hattori ........................ 438/20 |
| 6,303,972 B1 | * | 10/2001 | Agarwal ..................... 257/532 |

FOREIGN PATENT DOCUMENTS

| | | |
|---|---|---|
| JP | 63131545 A | 6/1988 |
| JP | 04180226 A | 6/1992 |
| JP | 06283520 A | 10/1994 |
| JP | 06291199 A | 10/1994 |
| WO | WO 99/03148 | 1/1999 |

OTHER PUBLICATIONS

Hiroaki Imai et al., *Significant densification of sol–gel derived amorphous silica films by vacuum ultraviolet irradiation*, J. Appl. Phys., 79 (11), Jun. 1, 1996, pp. 8304–8309.

* cited by examiner

Primary Examiner—George Fourson
Assistant Examiner—Michelle Estrada
(74) Attorney, Agent, or Firm—Townsend and Townsend and Crew (57) ABSTRACT

The present invention provides exemplary methods, apparatus and systems for planarizing an insulating layer, such as a borophosphosilicate glass (BPSG) layer, deposited over a substrate. In one embodiment, a substrate (140) is inserted into a substrate processing chamber and a BPSG layer (142) is deposited thereover. The BPSG layer has an upper surface that is generally non-planar, due in part to the underlying nonplanar substrate surface (130). The substrate is exposed to an ultraviolet (UV) light (160) at conditions sufficient to cause a reflow of the BPSG layer so that the BPSG layer upper surface (150) is generally planar. In this manner, photonic energy is used to promote BPSG reflow, thereby reducing the thermal budget requirements for such a process.

23 Claims, 7 Drawing Sheets

LOW THERMAL BUDGET SOLUTION FOR PMD APPLICATION USING SACVD LAYER

BACKGROUND OF THE INVENTION

The present invention relates to the formation of a borophosphosilicate glass ("BPSG") layer during the fabrication of integrated circuits on semiconductor wafers. More particularly, the present invention relates to an improved reflow process that reduces the thermal budget of a fabrication process while providing gap-filling properties that enable the BPSG layer to meet the requirements of modern day manufacturing processes.

Silicon oxide is widely used as an insulating layer in the manufacture of semiconductor devices. A silicon oxide film can be deposited by thermal chemical vapor deposition (CVD) or plasma enhanced chemical vapor deposition (PECVD) processes from a reaction of silane ($SiH_4$), tetraethoxysilane ($Si(OC_2H_5)_4$), hereinafter referred to as "TEOS," or a similar silicon-containing source, with an oxygen-containing source such as $O_2$, ozone ($O_3$), or the like.

One particular use for a silicon oxide film is as a separation layer between the polysilicon gate/interconnect layer and the first metal layer of MOS transistors. Such separation layers are referred to as premetal dielectric (PMD) layers because they are typically deposited before any of the metal layers in a multilevel metal structure. In addition to having a low dielectric constant, low stress and good adhesion properties, it is important for PMD layers to have good planarization and gap-fill characteristics.

When used as a PMD layer, the silicon oxide film is deposited over a silicon substrate having a lower level polysilicon gate/interconnect layer. The surface of the silicon substrate may include isolation structures, such as trenches, and raised or stepped surfaces, such as polysilicon gates and interconnects. The initially deposited film generally conforms to the topography of the substrate surface and is typically planarized or flattened before an overlying metal layer is deposited.

One method developed to fill the gaps and "planarize" or "flatten" the substrate surface involves forming a layer of relatively low-melting-point silicon oxide and then heating the substrate sufficiently to cause the layer to melt and flow as a liquid, resulting in a flat surface upon cooling. Such heating can be performed using either a rapid thermal pulse (RTP) method or conventional furnace, for example, and can be done in a dry (e.g., $N_2$ or $O_2$) or wet (e.g., steam $H_2/O_2$) ambient. Each process has attributes that make that process desirable for a specific application.

Because of its low dielectric constant, low stress, good adhesion and gap-fill properties and relatively low reflow temperature, borophosphosilicate glass ("BPSG") is one silicon oxide film that has found particular applicability in applications that employ a reflow step to planarize PMD layers. Standard BPSG films are formed by introducing a phosphorus-containing source and a boron-containing source into a processing chamber along with the silicon- and oxygen-containing sources normally required to form a silicon oxide layer.

As semiconductor design has advanced, the feature size of the semiconductor devices has dramatically decreased. Many integrated circuits (ICs) now have features, such as traces or trenches that are significantly less than a micron across. While the reduction in feature size has allowed higher device density, more chips per wafer, more complex circuits, lower operating power consumption, and lower cost, the smaller geometries have also given rise to new problems, or have resurrected problems that were once solved for larger geometries.

One manufacturing challenge presented by submicron devices is minimizing the overall thermal budget of the IC fabrication process in order to maintain shallow junctions and prevent the degradation of self-aligned titanium silicide contact structures, among other reasons. Hence, for at least this reason, it is desirable to provide methods of forming planarized insulating layers, such as BPSG layers, with lower thermal budget requirements.

SUMMARY OF THE INVENTION

The present invention provides exemplary methods, apparatus and systems for planarizing an insulating layer, such as a borophosphosilicate glass (BPSG) layer or an undoped silicate glass (USG) layer, deposited over a substrate.

In one embodiment, the method includes loading a substrate having a BPSG layer deposited thereover into a substrate processing chamber. In one embodiment, the BPSG layer is a premetal dielectric (PMD) layer, although the BPSG layer may be positioned elsewhere in the circuit device within the scope of the present invention. The BPSG layer has an upper surface that is generally non-planar. The substrate is exposed to an ultraviolet (UV) light at conditions sufficient to cause a reflow of the BPSG layer so that the upper surface is generally planar. The UV light is produced with a UV lamp, a laser, other provided UV light sources, and the like. In this manner, photonic energy is used instead of thermal energy to cause the insulating layer to reflow. The reflow fills the gaps, vias, trenches and the like, producing a generally planar surface.

In one embodiment, the UV light has a wavelength of about 150 nm±50 nm, although wavelengths throughout the UV spectrum may be used within the scope of the present invention. In alternative embodiments, the UV light has an energy level that is greater than about 10 electron volts (eV), and is about 15 eV.

The substrate, in one embodiment, is exposed to UV light for between about thirty (30) seconds and about fifteen (15) minutes. In another embodiment, the exposing step is maintained using UV light at an energy level that is at least about 10 eV, and for a duration that is at least about 30 seconds to produce sufficient reflow of the BPSG layer. In another embodiment, the UV light has a wavelength that is at least about 150 nm and the exposing step duration is at least about 30 seconds. It will be appreciated by those skilled in the art that the exposure time will depend, in part, on the UV light wavelength and/or energy, and the type and/or thickness of the insulating layer, among other things.

In one embodiment, the method includes maintaining a temperature in the substrate processing chamber between about 20 degrees Celsius and about 100 degrees Celsius during the exposing step. In this manner, a low thermal budget is used for the insulating layer reflow process.

In another embodiment, the exposing step exposes the substrate to UV light having a desired wavelength and a desired energy level to break at least some SiOH bonds in the BPSG layer. In this manner, the hydrogen content in the BPSG is reduced. Similarly, exposing the substrate to UV light helps densify the BPSG layer.

In another embodiment of the present invention, a method of forming a planarized insulating layer includes providing a substrate having a non-planar upper surface and depositing an insulating layer over the upper surface. The insulating layer has a generally non-planar upper surface, typically similar in contour to the substrate upper surface. The method includes exposing the insulating layer to a UV light at conditions sufficient to cause the insulating layer to reflow so that the insulating layer upper surface is generally planar. In one embodiment, the insulating layer comprises borophosphosilicate glass (BPSG), although other insulating layers, including other silicon oxide layers may be used within the scope of the present invention.

In one embodiment, the insulating layer is deposited by inserting the substrate into a substrate processing chamber and introducing a phosphorus-containing source and a boron-containing source into the processing chamber to deposit the BPSG insulating layer over the substrate. Examples of phosphorus-containing sources for use with the present invention include triethylphosphate (TEPO), triethylphosphite ($TEP_i$), trimethylphosphate (TMOP), trimethylphosphite ($TMP_i$), and similar compounds. Examples of boron-containing sources for use with the present invention include triethylborate (TEB), trimethylborate (TMB), and similar compounds.

In one embodiment, the depositing and exposing steps are both performed in a substrate processing chamber. Alternatively, the depositing and exposing steps are performed in separate processing chambers.

In one embodiment of the invention, a substrate processing apparatus comprises a processing chamber and a substrate holder located within the chamber for holding a substrate. A UV light source is coupled to the processing chamber and disposed to transmit a UV light towards the substrate holder, and hence towards the substrate. A controller for controlling the UV light source is included, with a memory coupled thereto. The memory includes a computer readable medium having a computer readable program embodied therein for directing operation of the UV light source. In one embodiment, the computer readable program includes a first set of instructions for controlling a wavelength of UV light produced by the UV light source, and a second set of instructions for controlling a duration that the UV light source produces UV light.

In another embodiment, the computer readable program further includes a third set of instructions for controlling an energy level of the UV light produced by the UV light source. In some embodiments, the apparatus or system further includes a gas distribution system coupled to the processing chamber for the deposition of an insulating layer on the substrate. In this manner, the same chamber can be used for both insulating layer formation and reflow.

These and other embodiments of the present invention along with many of its advantages and features are described in more detail in conjunction with the text below and attached figures.

DESCRIPTION OF THE SPECIFIC EMBODIMENTS

The present invention provides exemplary methods, apparatus and systems for reflowing an insulating layer, such as BPSG or other silicon oxide layer. The improved reflow method enables high aspect ratio, small width trenches or gaps to be filled. The method of the present invention is capable of reflowing appropriately formed BPSG layers to fill trenches having aspect ratios of 6:1 or more and trench widths as small as 0.06 microns. Further, methods, apparatus and systems of the present invention use ultraviolet (UV) light to promote the reflow of BPSG and other insulating layers, thereby reducing the thermal budget for forming planarized insulating layer surfaces.

Figure 1A:
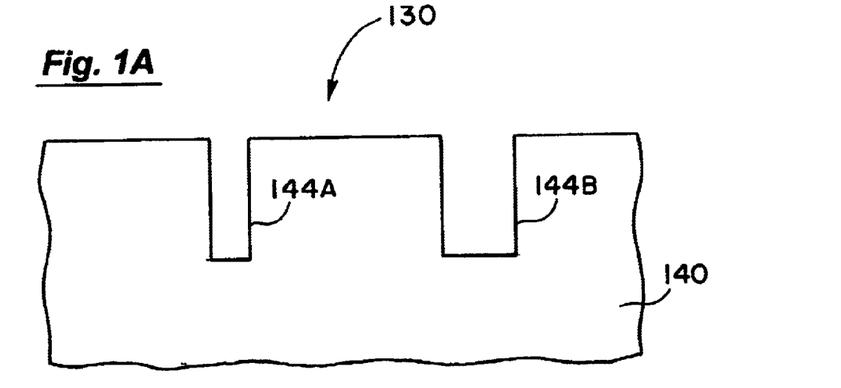
FIGS. 1A–1C are simplified cross-sectional views of a semiconductor substrate during various stages of processing according to methods of the present invention.
Figure 1B:
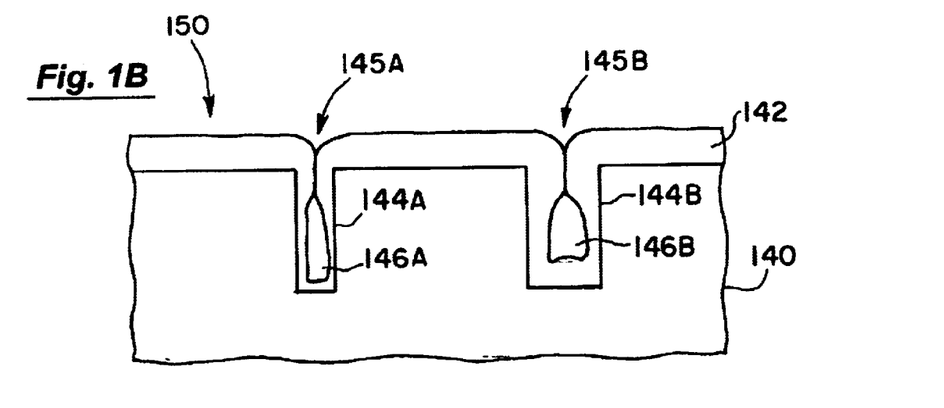
Figure 1C:
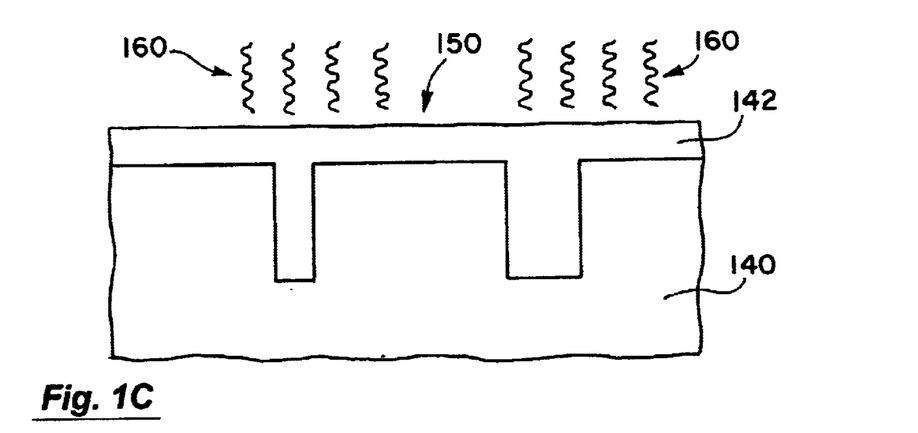

FIGS. 1A–1C depict simplified, cross-sectional views of a substrate 140 at various intermediate stages of the fabrication of integrated circuits upon the substrate in accordance with the present invention. FIGS. 1A–1C will be described in conjunction with FIG. 2, which depicts an exemplary method 200 according to the present invention.

FIG. 1A is a simplified cross sectional view of substrate 140 having a generally nonplanar upper surface 130. Substrate 140 may be formed with trenches, vias, raised surfaces and the like, as is known in the art. For example, as shown in FIG. 1A, substrate 140 includes a narrow trench area 144a and a wide trench area 144b. Substrate 140 is loaded or inserted into a processing chamber (FIG. 2, Step 210) prior to the formation of an insulating layer. One example of processing chambers and systems for use with methods of the present invention is described below in further detail in conjunction with FIGS. 3–6.

Figure 2:
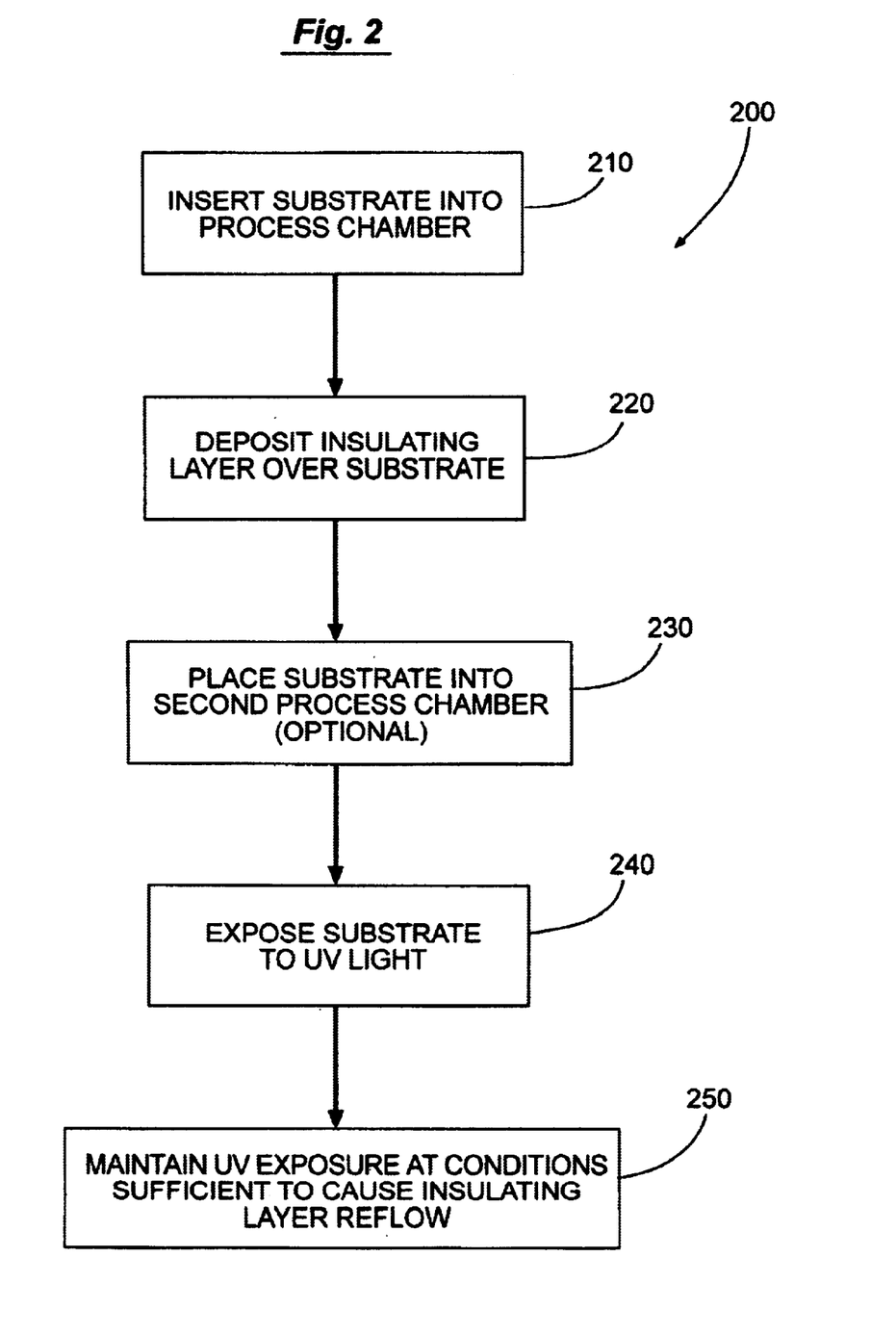
FIG. 2 is a flowchart illustrating steps undertaken in the planarization of an insulating layer according to a method of the present invention.

The method then includes depositing an insulating layer over the substrate surface (FIG. 2, Step 220). In one embodiment, the insulating layer comprises a BPSG layer 142, as shown in FIG. 1B. Borophosphosilicate glass (BPSG) layers may be formed generally by introducing a phosphorus-containing source and a boron-containing source into the processing chamber. In one embodiment, BPSG layer 142 is deposited according to a two-step deposition process as disclosed in U.S. patent application Ser. No. 09/076,170 entitled "A TWO-STEP BOROPHOSPHOSILICATE GLASS DEPOSITION PROCESS AND RELATED DEVICES AND APPARATUS" filed on May 5, 1998 and having Li-Qun Xia et al. listed as co-inventors. The Ser. No. 09/076,170 application is hereby incorporated herein by reference in its entirety.

In one embodiment, an upper surface 150 of BPSG layer 142 has a similar contour as upper surface 130 of substrate 140. After the deposition of BPSG layer 142, trench areas 144a and 144b are only partially filled because layer 142 has been "pinched off" in areas 145a and 145b during the deposition process leaving behind voids 146a and 146b. The deposition process is typically performed below atmospheric pressure, so the voids 146a and 146b are evacuated.

Prior art methods have attempted thermal treatments of substrate 140 to promote the reflow of BPSG layers to fill voids, such as voids 146a and 146b. The thermal treatment process typically uses temperatures of about 750° C. or higher. While achieving some degree of success, improved methods are desired which reduce the thermal budget necessary to form planarized BPSG surfaces.

To promote the reflow of BPSG layer 142, substrate 140 is exposed to a UV light 160 (FIG. 2, Step 240). The exposure of substrate 140 to UV light 160 may occur in the same process chamber as used for BPSG layer 142 deposition, or in a separate process chamber (FIG. 2, Step 230). UV light 160 may be provided by a UV lamp, a laser, other provided UV light sources, and the like.

Substrate 140 is exposed to UV light at conditions sufficient to cause the reflow of layer 142. The UV light used to promote the reflow of layer 142 may have a wavelength anywhere within the UV light spectrum. In one embodiment-the UV light used has a wavelength of about 150 nm±50 nm. Preferably, the UV light has an energy level that is greater than about 10 electron volts (eV). In one embodiment, the UV light has an energy level that is about 15 eV. The inventors have discovered that exposing layer 142 to UV light having approximately 15 eV energy level will promote the reflow of layer 142 in a non-heated environment. In other words, temperatures of between approximately 20° C. and 100° C. are maintained within a processing chamber during the exposure of substrate 140 to UV light.

The method includes maintaining the UV light exposure at conditions sufficient to cause insulating layer 142 reflow (FIG. 2, step 250). In one embodiment, the exposure time has a duration that is between about 30 seconds and about 15 minutes. In one embodiment, substrate 140 is exposed to UV light having a wavelength of about 150 nm for about sixty (60) seconds to promote the reflow of layer 142. In this manner, by using UV light to promote the reflow of insulating layer 142, and in particular BPSG layer 142, the overall thermal budget for producing such a layer is reduced. This is caused by the use of photonic energy in lieu of thermal energy to promote the reflow.

Another advantage of the use of UV light 160 to reflow insulating layer 142 is the reduction of the hydrogen content in layer 142. UV light, having the desired wavelength and energy level, break at least some of the SiOH bonds in BPSG layer 142. Since high levels of hydrogen (greater than 10%) can negatively impact the device performance, it often is desirable to reduce the hydrogen content in layer 142. Use of UV light desorbs some SiOH bonds, thereby reducing H content and increasing the device quality. For example, in some embodiments, UV light having a wavelength of about 100 nm, or about 150 nm, or about 200 nm and/or an energy level at least about 10 eV, or about 15 eV is used to break at least some of the SiOH bonds.

Further, the UV light acts to densify the insulating layer 142. In this manner the densified insulating layer 142 is generally devoid of voids, such as voids 146a and 146b depicted in FIG. 1B. As shown in FIG. 1C, the reflow of insulating layer 142 preferably produces a generally flat upper surface 150 after exposing substrate 140 to UV light and maintaining the exposure under conditions sufficient to promote the reflow. Substrate 140 then may undergo additional process steps, such as chemical-mechanical polishing (CMP) to further planarize upper surface 150, depositing a metal layer over insulating layer 142, and the like.

When BPSG layer 142 is deposited according to the process disclosed in the Ser. No. 09/076,170 application and reflowed according to the method of the present invention, the present inventors have been able to completely fill narrow trenches, such as trench 144a in FIG. 2A, having an aspect ratio of 6:1, and a trench width as small as 0.08 or 0.06 microns.

II. An Exemplary CVD System

Figure 3:
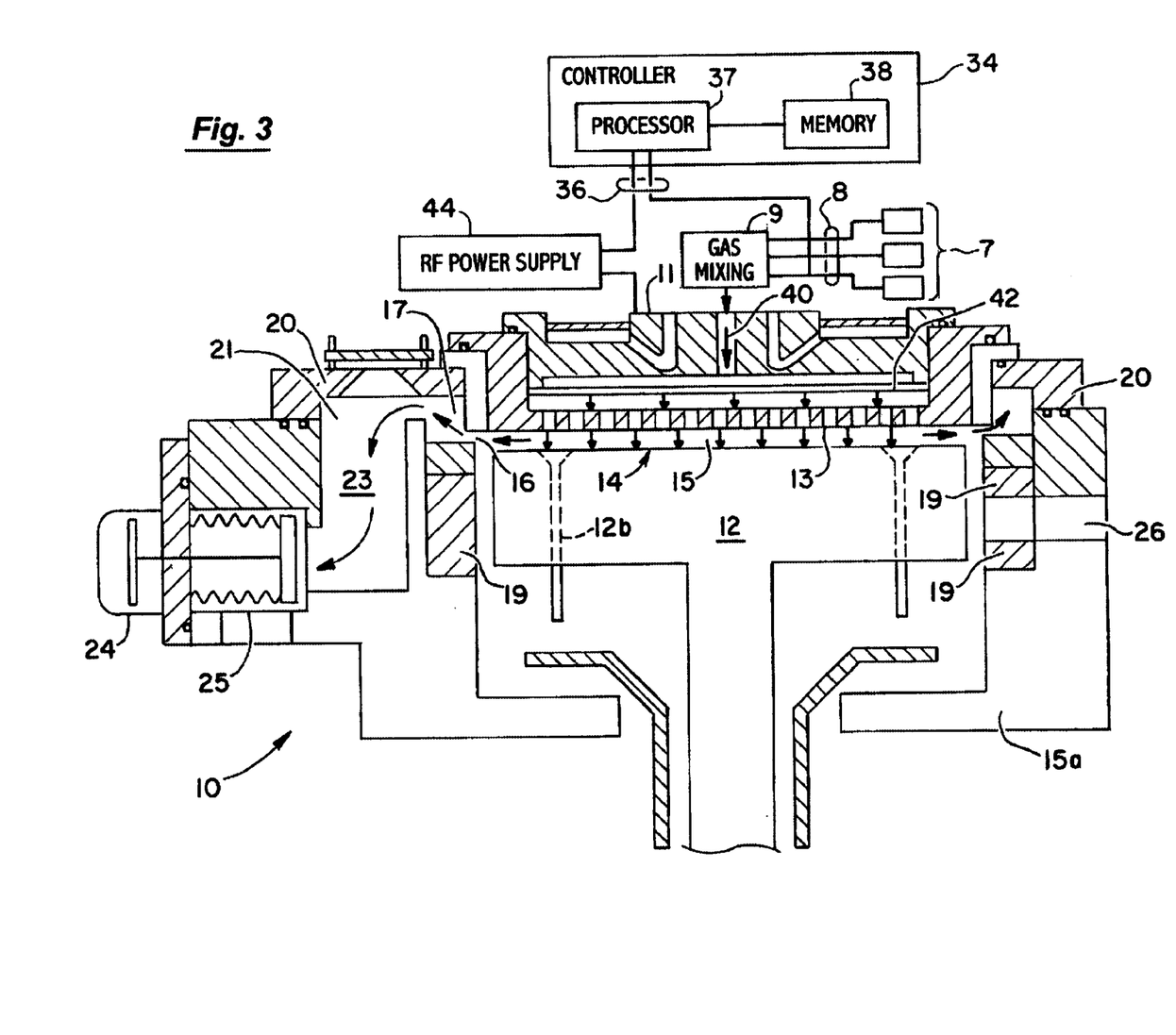
FIG. 3 is a side cross-sectional view of one embodiment of a deposition apparatus for use with the present invention.
Figure 4:
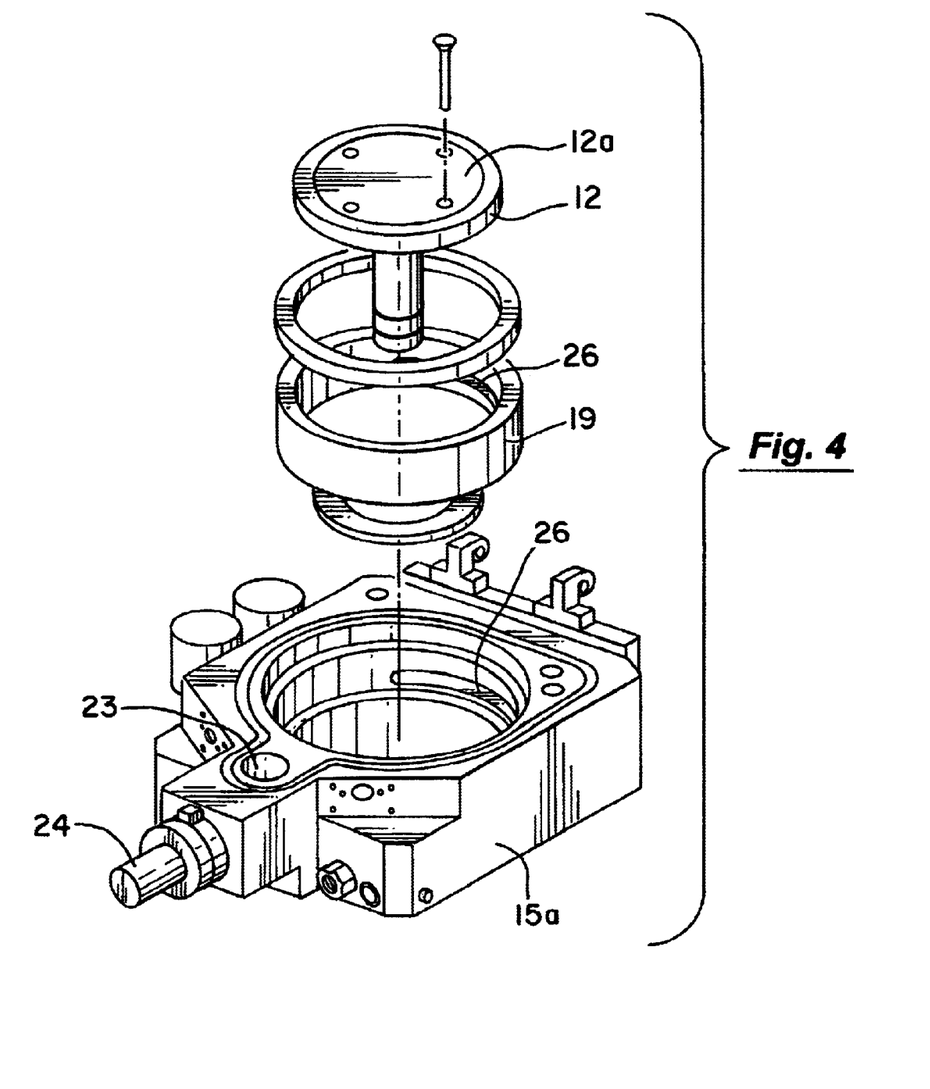
FIGS. 4 and 5 are exploded perspective views of parts of the apparatus depicted in FIG. 3.
Figure 5:
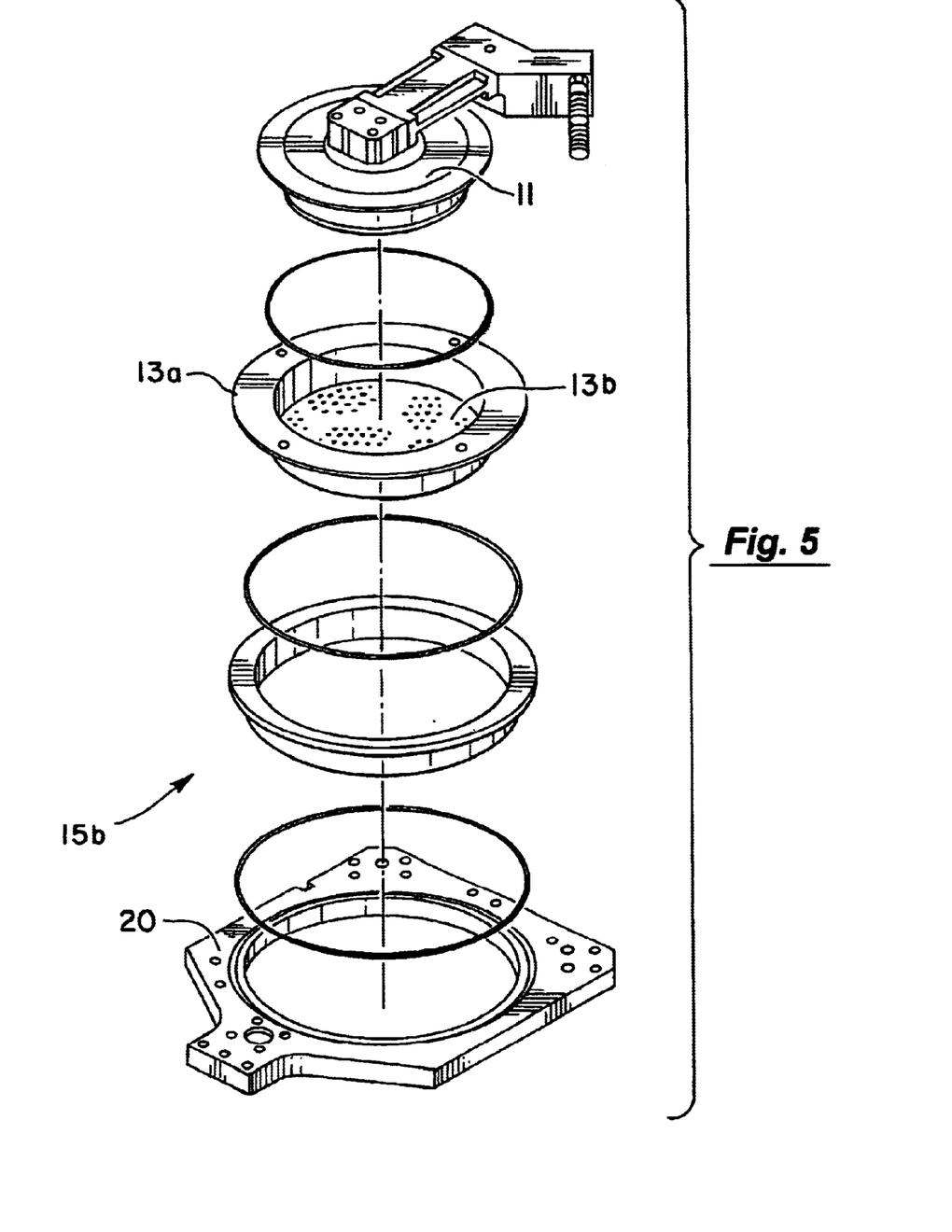

FIG. 3 depicts one suitable CVD apparatus in which at least portions of the methods of the present invention can be carried out. For example, deposition steps, including deposition of trench fill dielectrics and insulating layers may be carried out in the system of FIG. 3, or similar systems. Conventional systems known to those skilled in the art may be used for performing photoresist, etching, and CMP processes in accordance with the present invention.

FIG. 3 shows a vertical, cross-sectional view of a CVD system 10, having a vacuum or processing chamber 15 that includes a chamber wall 15a and chamber lid assembly 15b. Chamber wall 15a and chamber lid assembly 15b are shown in exploded, perspective views in FIGS. 4 and 5. CVD system 10 contains a gas distribution manifold 11 for dispersing process gases to a substrate (not shown) that rests on a heated pedestal 12 centered within the process chamber. During processing, the substrate (e.g. a semiconductor wafer) is positioned on a flat (or slightly convex) surface 12a (FIG. 4) of pedestal 12. The pedestal can be moved controllably between a lower loading/off-loading position (not shown) and an upper processing position (shown in FIG. 3), which is closely adjacent to manifold 11. A centerboard (not shown) includes sensors for providing information on the position of the wafers.

Deposition and carrier gases are introduced into chamber 15 through perforated holes 13b (FIG. 5) of a conventional flat, circular gas distribution or faceplate 13a. More specifically, deposition process gases flow into the chamber through the inlet manifold 11 (indicated by arrow 40 in FIG. 3), through a conventional perforated blocker plate 42 and then through holes 13b in gas distribution faceplate 13a.

Before reaching the manifold, deposition and carrier gases are input from gas sources 7 through gas supply lines 8 (FIG. 3) into a mixing system 9 where they are combined and then sent to manifold 11. Generally, the supply line for each process gas includes (i) several safety shut-off valves (not shown) that can be used to automatically or manually shut-off the flow of process gas into the chamber, (ii) mass flow controllers (also not shown) that measure the flow of gas through the supply line, and (iii) gas delivery line heating to prevent, for example, liquid condensation therein. When toxic gases (for example, ozone or halogenated gas) are used in the process, the several safety shut-off valves are positioned on each gas supply line in conventional configurations.

The deposition process performed in CVD system 10 can be either a thermal process or a plasma-enhanced process. In a plasma-enhanced process, an RF power supply 44 applies electrical power between the gas distribution faceplate 13a and the pedestal so as to excite the process gas mixture to form a plasma within the cylindrical region between the faceplate 13a and the pedestal. (This region will be referred to herein as the "reaction region"). Constituents of the plasma react to deposit a desired film on the surface of the semiconductor wafer supported on pedestal 12. RF power supply 44 is a mixed frequency RF power supply that typically supplies power at a high RF frequency (RF1) of 13.56 MHz and at a low RF frequency (RF2) of 360 KHz to enhance the decomposition of reactive species introduced into the vacuum chamber 15. In a thermal process, RF power supply 44 would not be utilized, and the process gas mixture thermally reacts to deposit the desired films on the surface of the semiconductor wafer supported on pedestal 12, which is resistively heated to provide thermal energy for the reaction.

During a plasma-enhanced deposition process or thermal process, a liquid is circulated through the walls 15a of the process chamber to maintain the chamber at a desired temperature, e.g., about 65 degrees Celsius. Fluids used to maintain the chamber walls 15a include the typical fluid types, i.e., water-based ethylene glycol or oil-based thermal transfer fluids. Maintaining the wall temperature beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction products, is evacuated from the chamber by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360° circular symmetry and uniformity of the slot orifice 16 and the plenum 17 are important to achieving a uniform flow of process gases over the wafer so as to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump (not shown) through a foreline (also not shown).

The wafer support platter of the pedestal 12 (preferably aluminum, ceramic, or a combination thereof) is resistively-heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 12.

Typically, any or all of the chamber lining, gas inlet manifold faceplate, and various other reactor hardware are made out of material such as aluminum, anodized aluminum, or ceramic. An example of such a CVD apparatus is described in U.S. Pat. No. 5,558,717 entitled "CVD Processing Chamber," issued to Zhao et al. The U.S. Pat. No. 5,558,717 patent is assigned to Applied Materials, Inc., the assignee of the present invention, and is hereby incorporated by reference.

A lift mechanism and motor (not shown) raises and lowers the heated pedestal assembly 12 and its wafer lift pins 12b as wafers are transferred into and out of the body of the chamber by a robot blade (not shown) through an insertion/removal opening 26 in the side of the chamber 10. The motor raises and lowers pedestal 12 between a processing position 14 and a lower, wafer-loading position. The motor, valves or flow controllers connected to the supply lines 8, gas delivery system, throttle valve, RF power supply 44, and chamber and substrate heating systems are all controlled by a system controller 34 (FIG. 3) over control lines 36, of which only some are shown. Controller 34 relies on feedback from optical sensors to determine the position of movable mechanical assemblies such as the throttle valve and susceptor which are moved by appropriate motors under the control of controller 34.

In a preferred embodiment, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 34 controls all of the activities of the CVD machine. The system controller executes system control software, which is a computer program stored in a computer-readable medium such as a memory 38. Preferably, memory 38 is a hard disk drive, but memory 38 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller 34.

Figure 6:
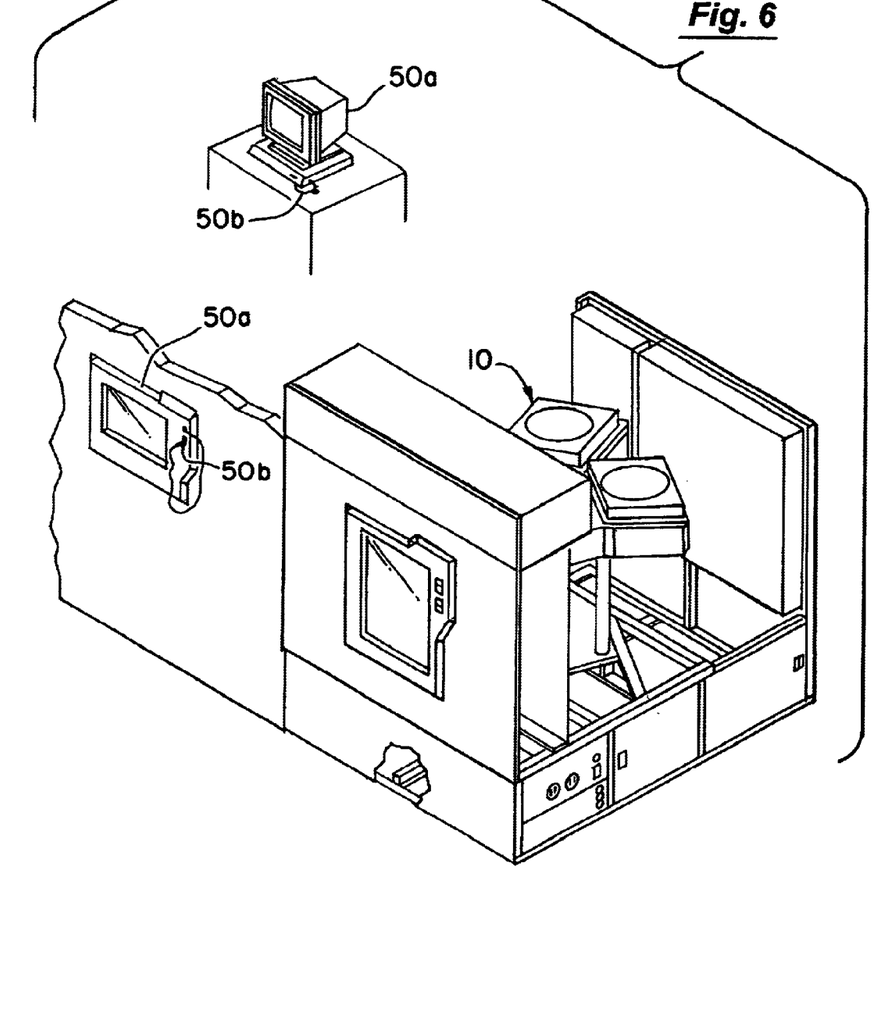
FIG. 6 is a simplified diagram of a system monitor in a multichamber system, which may include one or more chambers.

The interface between a user and controller 34 is via a CRT monitor 50a and light pen 50b, shown in FIG. 6, which is a simplified diagram of the system monitor and CVD system 10 in a substrate processing system, which may include one or more chambers. In the preferred embodiment two monitors 50a are used, one mounted in the clean room wall for the operators and the other behind the wall for the service technicians. The monitors 50a simultaneously display the same information, but only one light pen 50b is enabled. A light sensor in the tip of light pen 50b detects light emitted by CRT display. To select a particular screen or function, the operator touches a designated area of the display screen and pushes the button on the pen 50b. The touched area changes its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with controller 34.

The above reactor description is mainly for illustrative purposes, and other CVD equipment such as electron cyclotron resonance (ECR) plasma CVD devices, induction coupled RF high density plasma CVD devices, or the like may be employed. Additionally, variations of the above-described system, such as variations in pedestal design, heater design, RF power frequencies, location of RF power connections and others are possible. For example, the wafer could be supported by a susceptor and heated by infrared lamps through a quartz window.

Further, an ultraviolet (UV) light source may be coupled to or disposed in system 10 to provide UV light in accordance with the present invention. For example, the UV light source may be used in conjunction with an existing chamber used for deposition and other processes. This may occur, for example, by replacing the infrared lamp used to heat the process chamber with a UV lamp. In such a configuration, it may be desirable to replace the quartz window with a window constructed of material transparent to UV energy, such as sapphire and the like.

Figure 7A:
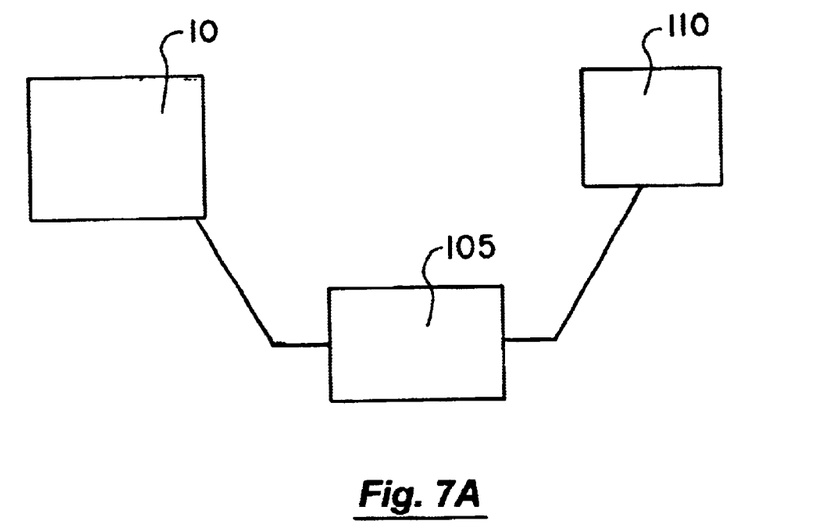
FIGS. 7A and 7B are schematics depicting processing systems and chambers of the present invention.

Alternatively, the UV light source may reside in a separate chamber in which Steps 240 and 250 (FIG. 2) are carried out. As shown in FIG. 7A, system 10 is used for processes such as BPSG deposition. A transfer mechanism 105 transfers substrate 140 from system 10 to a UV chamber 110. Transfer mechanism 105 may comprise, for example, a robot or the like, with arms or platens for transferring the substrate. A wide range of transfer mechanisms 105 may be used within the scope of the present invention.

Figure 7B:
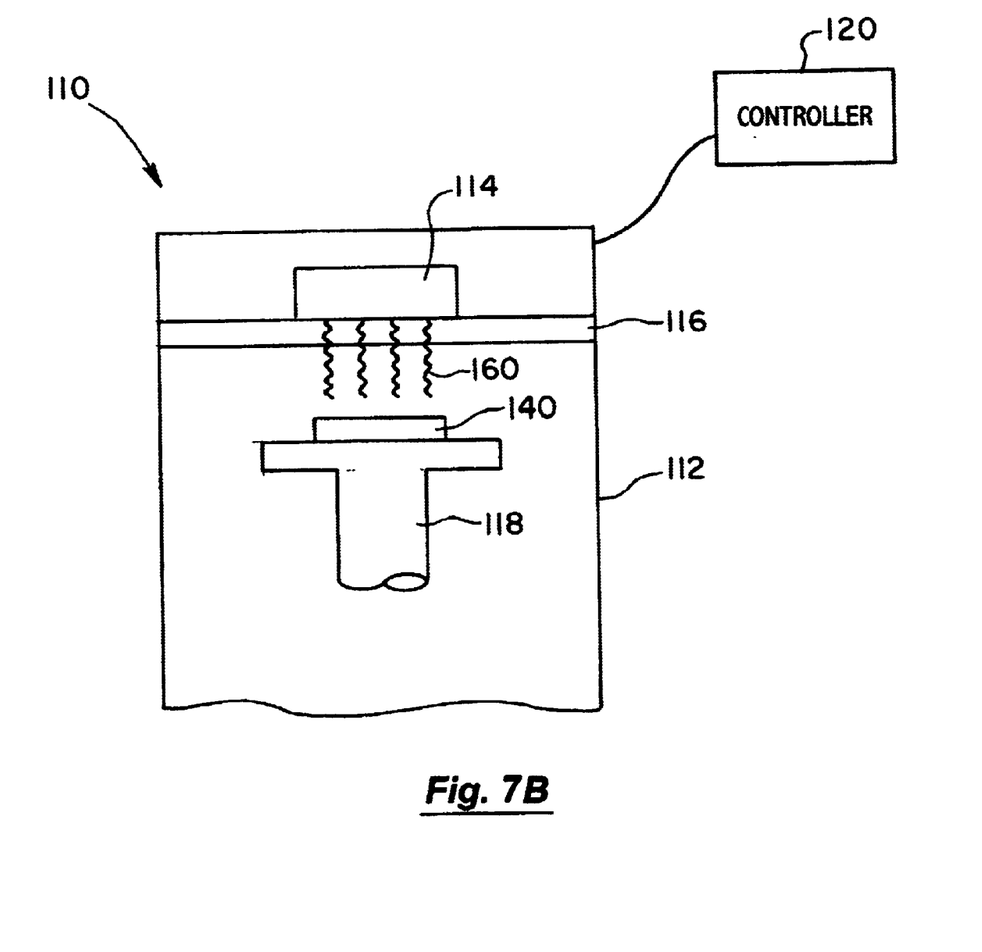

FIG. 7B depicts a schematic of one embodiment of UV chamber 110 according to the present invention. Chamber 110 includes a chamber wall 112 and a UV light source 114. Walls 112 operate to keep UV light from escaping chamber 110. UV light source 114 may comprise a UV lamp, a laser and a wide range of other UV light producing sources. UV light source 114 produces UV light 160, which passes through a window 116, such as a sapphire window that is at least partially transparent to UV energy. Alternatively, chamber 110 has no window. UV light 160 impinges upon substrate 140 having an insulating layer, such as BPSG layer 142, to which a reflow process is to occur. Substrate 140 may be resting on a pedestal 118, such as pedestal 12 shown in FIG. 3. In one embodiment, chamber 110 has a controller 120, which controls UV light source 114. In this manner, the energy level, wavelength, exposure time and the like may be controlled. Alternatively, controller 120 comprises controller 34 shown in FIG. 3. Controller 120 may implement, for example, one or more software programs which control the UV light source to produce the desired insulating layer reflow. Such software programs may control the UV light wavelength, energy, duration, and the like.

By exposing the insulating layer, such as BPSG layer 142, to UV light under desired conditions, layer 142 reflow is achieved. In this manner, after reflow, voids, vias and the like are filled and the layer 142 has a generally planar upper surface 150. Further, UV light acts to densify layer 142 and reduce H content therein to produce a high quality insulating layer. The above benefits are achieved with small thermal budget requirements.

The invention has now been described in detail. However, it will be appreciated that certain changes and modifications may be made. Hence, the scope of the invention should not be limited by the above description, but instead should be determined with reference to the appended claims along with their full scope of equivalents.

What is claimed is:

1. A method for planarizing a borophosphosilicate glass (BPSG) layer deposited over a substrate, said method comprising:

loading a substrate having a BPSG layer deposited thereover into a substrate processing chamber, said BPSG layer having a non-planar upper surface;

maintaining a temperature in the substrate processing chamber between about 20 degrees Celsius and about 100 degrees Celsius; and exposing said substrate to an ultraviolet (UV) light at conditions sufficient to cause a reflow of said BPSG so that said upper surface comprises a planar upper surface portion as a result of the reflow.

2. The method as in claim 1, further comprising producing said in light with a UV lamp.

3. The method as in claim 1, further comprising producing said UV light with a laser.

4. The method as in claim 1, wherein said UV light has a wavelength of about 150 nm±50 nm.

5. The method as in claim 1, wherein said UV light has an energy level that is greater than about 10 electron volts (eV).

6. The method as in claim 1, wherein said UV light has an energy level that is about 15 eV.

7. The method as in claim 1, wherein said exposing step has a duration that is between about thirty (30) seconds and about fifteen (15) minutes.

8. The method as in claim 1, wherein said exposing step comprises exposing said substrate to said UV light having a desired wavelength and a desired energy level to break at least some SiOH bonds in said BPSG layer.

9. The method as in claim 1, wherein said exposing step densifies said BPSG layer.

10. The method as in claim 1, wherein said BPSG layer comprises a premetal dielectric (PMD) layer.

11. A method for planarizing an insulating layer deposited over a substrate, said method comprising:

providing said substrate having said insulating layer deposited thereover;

providing a UV light source;

exposing said substrate to UV light from said UV light source; and maintaining said UV light at an energy level that is at least about 10 eV for a duration that is at least about 30 seconds to reflow said insulating layer to produce a planar portion of the insulating layer upper surface;

wherein said insulating layer comprises borophosphosilicate glass (BPSG).

12. The method as in claim 11, wherein said maintaining step comprises maintaining said UV light at an energy level that is at least about 10 eV for a duration that is between about 30 seconds and about fifteen minutes to produce said reflow of said BPSG.

13. The method as in claim 11, wherein said maintaining step comprises maintaining said UV light at a wavelength of about 150 nm and for a duration that is at least about 30 seconds.

14. A method of forming a planarized insulating layer, said method comprising:

providing a substrate having a non-planar upper surface;

depositing an insulating layer over said upper surface, said insulating layer having a non-planar upper surface; and exposing said insulating layer to a UV light at conditions sufficient to cause said insulating layer to reflow so that said insulating layer upper surface comprises a planar upper surface portion, wherein the substrate is maintained in a processing chamber at a temperature between about twenty (20) degrees Celsius and about one hundred (100) degrees Celsius during the exposing;

wherein said insulating layer comprises borophosphosilicate glass (BPSG).

15. The method as in claim 14, wherein said depositing step comprises:

inserting said substrate into a substrate processing chamber; and introducing a phosphorus-containing source and a boron-containing source into said processing chamber to deposit said BPSG insulating layer over said substrate.

16. The method as in claim 14, further comprising performing said depositing step in a first processing chamber and said exposing step in a second processing chamber.

17. The method as in claim 14 wherein the substrate non-planar upper surface comprises at least one trench having an aspect ratio of about 6:1, and wherein the reflow operates to fill the trench with the insulating layer.

18. A method of forming a planarized insulating layer, said method comprising:

providing a substrate having a non-planar upper surface;

depositing an insulating layer over said upper surface, said insulating layer having a non-planar upper surface;

exposing said insulating layer to a UV light at conditions sufficient to cause said insulating layer to reflow so that said insulating layer upper surface comprises a planar upper surface portion, wherein the substrate is maintained in a processing chamber at a temperature between about twenty (20) degrees Celsius and about one hundred (100) degrees Celsius during the exposing; and performing said depositing and exposing steps in a substrate processing chamber.

19. The method as in claim 18, wherein said UV light has an energy level that is at least about 10 eV.

20. The method as in claim 18 wherein the UV light has an energy level of at least about 15 eV.

21. The method as in claim 18 wherein the substrate non-planar upper surface comprises at least one trench having an aspect ratio of about 6:1, and wherein the reflow operates to fill the trench with the insulating layer.

22. A method of forming a planarized insulating layer, said method comprising:

providing a substrate having a non-planar upper surface;

depositing an insulating layer over said upper surface, said insulating layer having a non-planar upper surface;

exposing said insulating layer to a UV light at conditions sufficient to cause said insulating layer to reflow so that said insulating layer upper surface comprises a planar upper surface portion, wherein the substrate is maintained in a processing chamber at a temperature between about twenty (20) degrees Celsius and about one hundred (100) degrees Celsius during the exposing; and performing a chemical-mechanical polishing (CMP) process to the insulating layer upper surface after the exposing to further planarize the upper surface.

23. The method as in claim 22 further comprising performing said depositing step in a first processing chamber and said exposing step in a second processing chamber.

* * * * *